(12) United States Patent
Afzali-Ardakani et al.

(10) Patent No.: US 8,895,417 B2
(45) Date of Patent: Nov. 25, 2014

(54) REDUCING CONTACT RESISTANCE FOR FIELD-EFFECT TRANSISTOR DEVICES

(75) Inventors: Ali Afzali-Ardakani, Ossining, NY (US); Bhupesh Chandra, Jersey City, NJ (US); George Stojan Tulevski, White Plains, NY (US); Fengnian Xia, Plainsboro, NJ (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 13/306,276

(22) Filed: Nov. 29, 2011

(65) Prior Publication Data

US 2013/0134391 A1  May 30, 2013

(51) Int. Cl.
*H01L 21/04* (2006.01)
*H01L 21/02* (2006.01)

(52) U.S. Cl.
USPC .......................................... 438/510; 257/607

(58) Field of Classification Search
None
See application file for complete search history.

(56) References Cited

U.S. PATENT DOCUMENTS

| | | | |
|---|---|---|---|
| 6,891,227 B2 | 5/2005 | Appenzeller et al. | |
| 7,132,714 B2 | 11/2006 | Bae et al. | |
| 7,253,431 B2 | 8/2007 | Afzali-Ardakani et al. | |
| 7,492,015 B2 * | 2/2009 | Chen et al. | 257/369 |
| 7,666,382 B2 | 2/2010 | Ghenciu et al. | |
| 7,666,708 B2 | 2/2010 | Lieber et al. | |
| 2005/0076581 A1 | 4/2005 | Small et al. | |
| 2006/0038179 A1 | 2/2006 | Afzali-Ardakani et al. | |
| 2006/0063318 A1* | 3/2006 | Datta et al. | 438/197 |
| 2006/0105523 A1 | 5/2006 | Afzali-Ardakani et al. | |
| 2007/0258147 A1 | 11/2007 | van der Boom et al. | |
| 2008/0001141 A1 | 1/2008 | Gruner et al. | |
| 2008/0023066 A1 | 1/2008 | Hecht et al. | |
| 2008/0213367 A1 | 9/2008 | Sarkar et al. | |
| 2008/0299710 A1 | 12/2008 | Tombler, Jr. et al. | |
| 2008/0308407 A1 | 12/2008 | Rostovtsev et al. | |
| 2009/0032804 A1* | 2/2009 | Kalburge | 257/24 |
| 2009/0146111 A1 | 6/2009 | Shin et al. | |
| 2009/0179193 A1 | 7/2009 | Appenzeller et al. | |
| 2010/0051897 A1* | 3/2010 | Chen et al. | 257/9 |
| 2010/0206362 A1 | 8/2010 | Flood | |
| 2010/0308375 A1 | 12/2010 | Birkhahn | |
| 2011/0048508 A1 | 3/2011 | Afzali-Ardakani et al. | |
| 2011/0143045 A1* | 6/2011 | Veerasamy | 427/495 |

(Continued)

FOREIGN PATENT DOCUMENTS

EP      1998385 A2    3/2008
WO    2008057615 A2    5/2008

OTHER PUBLICATIONS

Khairoutdinov et al., Persistent Photoconductivity in Chemically Modified Single-Wall Carbon Nanotubes, J. Phys. Chem. B, vol. 108, No. 52, 2004. pp. 19976-19981.

(Continued)

*Primary Examiner* — Scott B Geyer
(74) *Attorney, Agent, or Firm* — Ryan, Mason & Lewis, LLP

(57) ABSTRACT

A method and an apparatus for doping at least one of a graphene and a nanotube thin-film transistor field-effect transistor device to decrease contact resistance with a metal electrode. The method includes selectively applying a dopant to a metal contact region of at least one of a graphene and a nanotube field-effect transistor device to decrease the contact resistance of the field-effect transistor device.

21 Claims, 10 Drawing Sheets

(56) References Cited

U.S. PATENT DOCUMENTS

| | | | |
|---|---|---|---|
| 2011/0284818 A1* | 11/2011 | Avouris et al. | 257/9 |
| 2012/0052308 A1 | 3/2012 | El-Ashry et al. | |
| 2012/0056161 A1* | 3/2012 | Avouris et al. | 257/24 |
| 2012/0225296 A1* | 9/2012 | Zhong et al. | 428/408 |
| 2013/0130037 A1 | 5/2013 | Bol et al. | |

OTHER PUBLICATIONS

Kavan et al., Supramolecular Assembly of Single-Walled Carbon Nanotubes with a Ruthenium(II)-Bipyridine Complex: An in Situ Raman Spectroelectrochemical Study, J. Phys. Chem. C, vol. 113, No. 6, 2009, pp. 2611-2617.

Shiozawa et al., Screening the Missing Electron: Nanochemistry in Action, Phys. Rev. Lett. 102, 2009, 046804.

Durkop et al., Extraordinary Mobility in Semiconducting Carbon Nanotubes, Nano Letters, vol. 4, No. 1, 2004, pp. 35-39.

Luong et al., Oxidation Deformation, and Destruction of Carbon Nanotubes in Aqueous Ceric Sulfate, J. Phys. Chem. B, vol. 109, No. 4, 2005, pp. 1400-1407, Web Publication date Jan. 8, 2005.

Yang et al., Preparation of Water-Soluble Multi-Walled Carbon Nanotubes by Ce(IV)-induced Redox Radical Polymerization, Progress in Natural Science, vol. 19, 2009, pp. 991-996.

Cresti et al., Charge Transport in Disordered Graphene—Based Low Dimensional Materials, Nano Res (2008) 1:361-394.

* cited by examiner

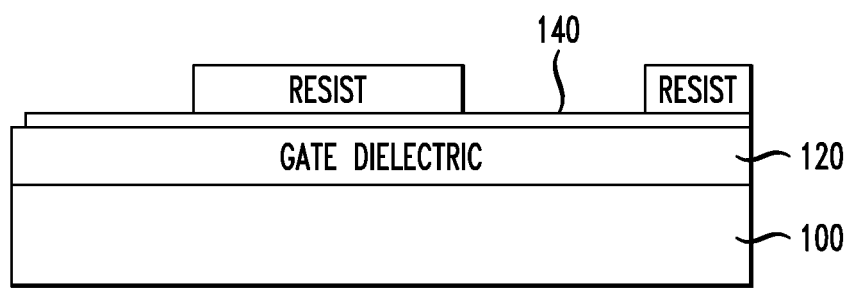
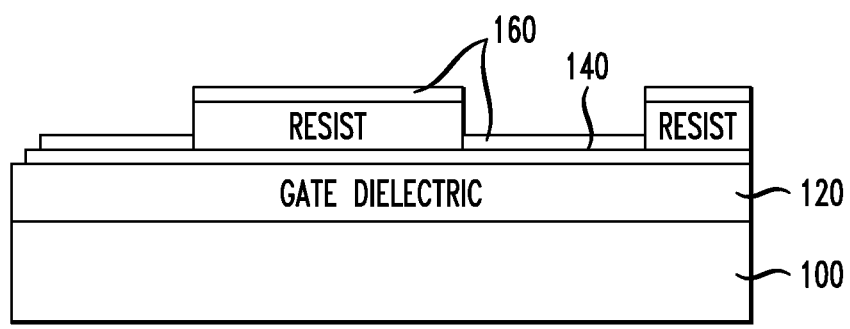

REDUCING CONTACT RESISTANCE FOR FIELD-EFFECT TRANSISTOR DEVICES

CROSS-REFERENCE TO RELATED APPLICATIONS

The present application is related to U.S. patent application Ser. No. 13/306,357, entitled "Doping Carbon Nanotubes and Graphene for Improving Electronic Mobility," and filed concurrently herewith, the disclosure of which is incorporated by reference herein in its entirety.

FIELD OF THE INVENTION

Embodiments of the invention generally relate to electronic devices and, more particularly, to logic device performance.

BACKGROUND OF THE INVENTION

Graphene and Carbon Nanotubes (CNT) are candidates for replacing silicon in high and medium performance logic devices. One factor affecting the performance of these devices is the contact resistance arising at the metal-CNT/Graphene interface. This resistance is the main contributor of mobility degradation in short channel devices. Several solutions have been suggested to overcome this problem, such as using a high work function metal, which can lower the schottky barrier at the metal-p-type nanotube interface, thereby decreasing the resistance at the contacts.

However, such an approach depends heavily on the work function of the material being probed, which in the case of CNTs varies with tube diameter. For example, in the absence of a suitable high work function metal, it is difficult to make satisfactory contacts onto small diameter CNTs.

Another existing approach to reduce the barrier at the contacts is to increase the electron density at the interface. This thins down the tunnel barrier present at the interface due to increase in electrical band bending, helping a direct tunneling of the electron into the CNT. Typically, such an effect is achieved using an external gate field in a field-effect transistor (FET) type structure. However, effect of gate on the contacts may vary this depending upon FET device geometry due to the change in electrostatics of the system. Also, gate fields are not able to penetrate near the metal-CNT/graphene contacts due to shielding by contact metals. This is particularly the case where metal is beneath the CNT/graphene channel (bottom contacted devices).

Accordingly, there is a need for reducing contact resistance for contacts to CNT/graphene.

SUMMARY OF THE INVENTION

In one aspect of the invention, a method for doping a graphene and nanotube thin-film transistor field-effect transistor device to decrease contact resistance with a metal electrode is provided. The method includes the steps of selectively applying a dopant to a metal contact region of a graphene and nanotube field-effect transistor device to decrease the contact resistance of the field-effect transistor device. The decrease in contact resistance post doping is due to the increase in charge carrier concentration at the metal-CNT/graphene interface.

Another aspect of the invention includes an apparatus that includes a substrate, a graphene and nanotube field-effect transistor device fabricated on the substrate with an exposed contact region, wherein the contact region is doped with a dopant, and contact metal deposited over the doped contact region of the graphene and nanotube field-effect transistor device.

In another aspect of the invention, graphene and CNT electrical materials are transferred over pre-fabricated electrodes, and the regions of the materials over the electrodes are selectively doped.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 1 illustrates a step in forming a field effect transistor (FET), according to an embodiment of the present invention;

FIG. 2 illustrates a step in forming a field effect transistor (FET), according to an embodiment of the present invention;

DETAILED DESCRIPTION OF EMBODIMENTS

Figure 3:
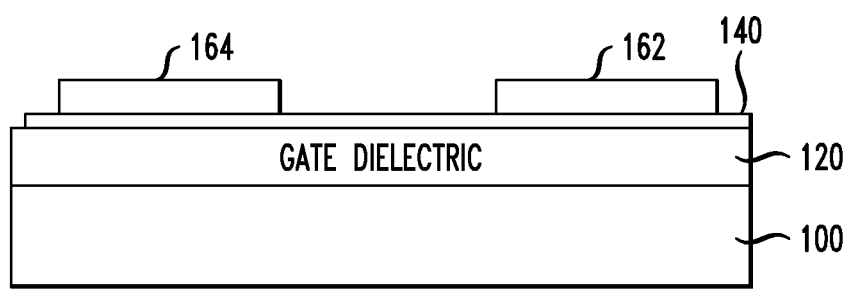
FIG. 3 illustrates a step in forming a field effect transistor (FET), according to an embodiment of the present invention.

An aspect of the invention includes techniques for doping carbon nanotubes (CNT) and graphene to decrease the contact resistance with metal electrodes. As described herein, resistance between CNT/graphene and contact metal is reduced through doping of the contact regions using various chemical CNT/graphene dopants. The dopant permanently increases the electron density at the contacts, making these regions metallic. This makes the band bending at the interface very sharp, causing the tunneling barriers to thin down, and hence decreases the contact resistance.

Doping is preferably conducted in solution phase, although gas phase doping is also feasible. For solution processes, organic solvents such as dichlorobenzene, dichloromethane, ethanol, acetonitrile, chloroform, methanol, butanol, among others, are suitable. Doping can be accomplished via charge transfer from the dopants to the nano-components, for example, interaction of the lone electron pairs of doping molecules with the quantum confined orbitals of semiconductor nanowires and nanocrystals which affects the concentration of carriers involved in charge transport.

With solution phase doping, for example, nano-components can be doped before and/or after their integration into a circuit on a chip. Nano-components can also be doped locally on the chip using techniques such as inkjet printing. The doping level along a nanowire, nanotube or a nanocrystal film can be varied by masking certain portions (for example, contacts) of the nano-component with resist and doping only the exposed portions. For device applications, nanowires can be protected from damage by implementing the doping at an appropriate stage during process integration.

Nanotubes, for example, carbon nanotubes, can be doped either in bulk by suspension of the nanotubes in a dopant solution, with or without heating; or immersing in the dopant solution a substrate supporting the nanotubes. Although carbon nanotubes are used as examples in the following discussions, doping methods of this invention can also be applied to other semiconducting nanotubes, which may include, for example, graphene, pentascene, fuellerence, etc, and combinations thereof.

Interaction of carbon nanotubes with the dopants, for example, via charge transfer, results in the formation of charged (radical cation) moieties close to the nanotubes. Bulk doping can be achieved by stirring a suspension of the carbon nanotubes in a dopant solution at a preferred temperature from about 20 degrees Celsius (C) to about 50 degrees C., with a dopant concentration preferably from about 1 millimole (mM) to about 10 moles (M). Depending on the specific dopants and solvents, however, concentration ranging from about 0.0001 M to about 10 M may be used with temperatures from about 0 degrees C. to about 50 degrees C.

In general, the extent of doping depends on the concentration and temperature of the doping medium, and process parameters are selected according to the specific nano-component, dopant and solvent combination, as well as specific application needs or desired device characteristics.

Device doping, that is, doping the nanotube after it has been incorporated as part of a device structure of substrate, can be achieved by exposing the device or substrate with the nanotube to a dopant solution. By appropriately masking the nanotube, selective doping of portions of the nanotube can be achieved to produce desired doping profiles along the nanotube. As noted above, dopant concentration is preferably in the range of about 0.1 mM to about 10 M, more preferably from about 1 mM to about 1 M, and most preferably, from about 1 mM to about 10 mM, with the solution temperature preferably from about 10 degrees C. to about 50 degrees C., and more preferably, from about 20 degrees C. to about 50 degrees C. With device doping, the choice of process conditions also depends on compatibility with other materials present on the device or substrate. For example, while lower dopant concentrations tend to be less effective in general, too high a concentration of certain dopants may result in potential corrosion issues. In one embodiment, the doping is done under a $N_2$ atmosphere without stirring or agitation of the solution. However, agitation of the solution can be acceptable as long as it does not cause damage to the device.

As detailed below, FIGS. 1-4 illustrate steps of a method for forming a field effect transistor (FET). Accordingly, FIG. 1 illustrates a step in forming a field effect transistor (FET), according to an embodiment of the present invention. A gate dielectric 120 such as silicon dioxide, or oxynitride, or a high Kelvin (K) material layer is deposited on substrate 100, which is generally a doped silicon substrate. In an embodiment of the invention, the silicon substrate is degenerately doped. The gate dielectric can have a thickness, for example, from about 1 to about 100 nanometers (nm). A nano-component 140, for example, carbon nanotube, is deposited on gate dielectric 120 by spin-coating. As used, described and depicted herein, nano-component 140 can refer to a carbon nanotube, a film of carbon nanotubes, a single CNT or CNT film, graphene flakes film or a single layer of graphene. A resist pattern is then formed on the carbon nanotube 140 by conventional lithographic techniques. For example, a resist layer can be deposited over the carbon nanotube 140 and patterned by using e-beam lithography or photolithography. With a positive resist, regions of the resist layer exposed to the e-beam or lithographic radiation are removed by using a developer, resulting in a structure with resist pattern shown in FIG. 1.

The resist pattern formed on the carbon nanotube may have one or multiple separations from about 10 nm to about 500 nm when e-beam lithography is used, and from about 500 nm to about 10 μm with photolithography. The multiple separations correspond to the line and space separations resulting from the respective lithographic techniques, and represent separations between adjacent top gates. The availability of multiple top gates provides flexibility of individual control for different logic applications, for example, AND, OR, NOR operations.

As shown in FIG. 2, a metal 160, having a thickness ranging from about 15 nm to about 50 nm, is deposited on the resist pattern and over portions of the carbon nanotube 140. The metal can be Pd, Ti, W, Au, Co, Pt, or alloys thereof, or a metallic nanotube. If a metallic nanotube is used, the metal 160 may include one or more metallic nanotubes. Other metals or alloys of Pd, Ti, W, Au, Co, Pt, can be deposited by e-beam or thermal evaporation under vacuum, while metallic nanotubes can be deposited with solution phase techniques such as spin coating.

Following deposition of the metal, the structure can be immersed in acetone or N-methylpyrrolidone (NMP) for resist liftoff, a process that removes the lithographically patterned resist and the metal deposited on top by soaking the sample in solvents such as acetone or NMP. For example, such solvents can also be referred to generally as resist liftoff components.

Figure 4:
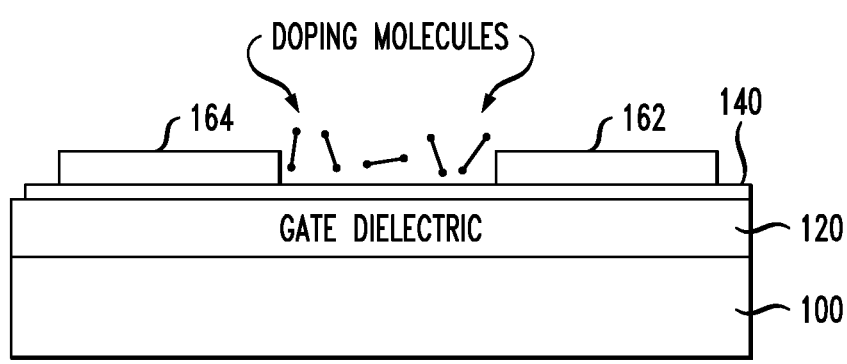
FIG. 4 illustrates a step in forming a field effect transistor (FET), according to an embodiment of the present invention.

As depicted in FIG. 3, the metal portions 162 and 164 remaining on the carbon nanotube 140 form the FET source and drain. In this embodiment, the source and drains are formed over a first and a second region, respectively, of the carbon nanotube 140, or more generally, of the nano-component 140. Following resist liftoff, the structure in FIG. 3 with the carbon nanotube 140 is immersed in an organic solution comprising a suitable dopant as described herein in connection with an embodiment of the invention. FIG. 4 illustrates the doping molecules bonding to the carbon nanotube 140. The doped portion of the carbon nanotube 140 (between the metal source and drain) acts as the channel of the FET.

Figure 5:
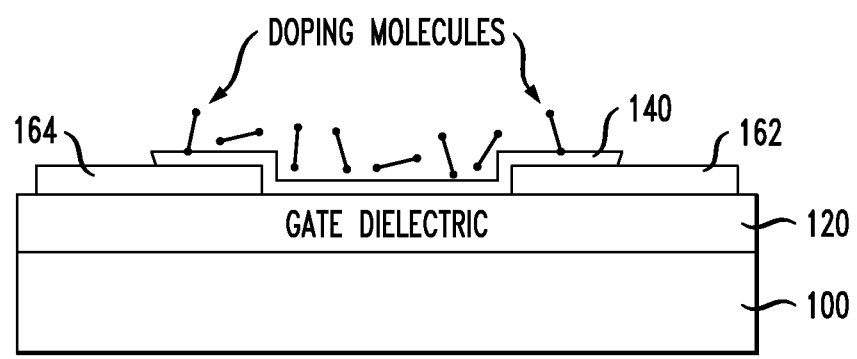
FIG. 5 illustrates another embodiment of forming a carbon nanotube FET (CNFET), according to an embodiment of the present invention.

FIG. 5 illustrates another embodiment of forming a carbon nanotube FET, or more generally, a FET with a channel comprising a nano-component such as other semiconducting nanotubes, nanowires or nanocrystal films. After the formation of gate dielectric 120 on substrate 100, metal portions 162 and 164 are formed on gate dielectric 120 using a resist liftoff process (not shown) similar to that described for FIGS. 1-4. Metal portions 162 and 164, each having a thickness from about 15 nm to about 300 nm, form the FET source and drain. Metals such as Pd, Ti, W, Au, Co and Pt, and alloys thereof, or one or more metallic nanotubes can be used for the metal portions 162, 164. A carbon nanotube 140, or more generally, a nano-component, is then disposed, for example, by spin-coating, over the gate dielectric 120 and the metal portions 162 and 164. Blanket doping of the carbon nanotube 140 is achieved by immersing the structure in an organic solution comprising a suitable dopant. The dopant molecules bond to the carbon nanotube, for example, via charge transfer interaction with the nitrogen of a dopant (for example, such as detailed herein) donating a lone pair of electrons to the carbon nanotube. In this illustration, the portion of the carbon nanotube 140 in contact with the gate dielectric 120 forms the channel of the FET.

Alternatively, the carbon nanotube 140 can be selectively doped through a patterned resist (not shown) that is formed over the carbon nanotube 140. The patterned resist may be formed, for example, by depositing a suitable resist material over the carbon nanotube 140 and patterning using conventional lithographic techniques. Hydrogensilsesquioxanes (HSQ), a dielectric that can be used as a negative resist, may be used for this purpose. Also, in an aspect of the invention, conventional resist materials can be used such as poly(methyl methacrylate) (PMMA), etc. This is made possible due to the use of water soluble dopants such as cerium ammonium nitrate, cerium ammonium sulfate, and ruthenium bipyridyl complex.

Figure 6:
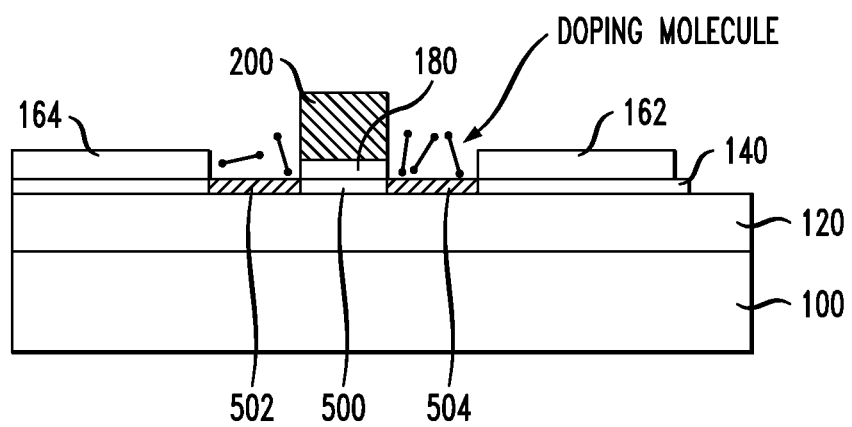
FIG. 6 illustrates an embodiment of a dual-gate CNFET, according to an embodiment of the present invention.

FIG. 6 illustrates an embodiment of a dual-gate carbon nanotube FET, or more generally, a FET with a channel comprising a nano-component such as other semiconducting nanotubes, nanowires or nanocrystal films. After the gate dielectric 120 is formed over the substrate 100, which acts as a first gate (also referred to as a bottom or back gate), a carbon nanotube, or more generally, a nano-component 140 is deposited on gate dielectric 120. Metal portions 162, 164 are formed over the carbon nanotube 140 using a resist liftoff technique such as that described in connection with FIGS. 1-4. After metal portions 162, 164 are formed (acting as source and drain of the FET), the structure containing the carbon nanotube 140 and metal portions 162, 164 is covered with a dielectric layer 180, which can be a low temperature oxide (LTO) or a chemical vapor deposition (CVD) high dielectric material such as hafnium dioxide.

A second gate 200 (also referred to as top or front gate), which can include a metal or highly doped polysilicon, is formed over the dielectric layer 180, for example, by first depositing a gate material over dielectric layer 180 and then patterning to form top gate 200. With the top gate 200 acting as an etch mask, the dielectric layer 180 is etched such that only the portion underneath the top gate 200 remains, as shown in FIG. 6. As an example, a dilute hydrofluoric acid (HF) such as 100:1 HF can be used as an etchant for LTO.

Additionally, the device is immersed in a dopant solution to achieve partial doping of the carbon nanotube 140. In this case, the channel includes both the gated undoped region 500 and the two doped regions 502 and 504. The doped regions 502 and 504 act like the "extensions" of a complementary metal oxide semiconductor (CMOS) FET, resulting in reduced contact barrier and improvements in drive current and transistor switching. The device can be operated by either the top gate 200 or the bottom substrate 100, or both. In logic applications, it is desirable to operate a FET with the top gate configuration for good alternating current (AC) performance.

Figure 7:
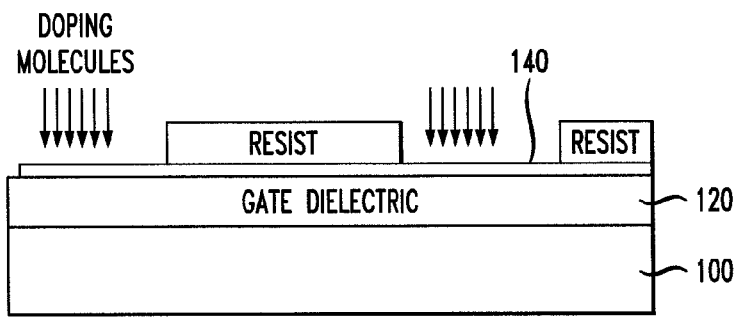
FIG. 7 illustrates a step in another embodiment of forming a CNFET, according to an embodiment of the present invention.
Figure 8:
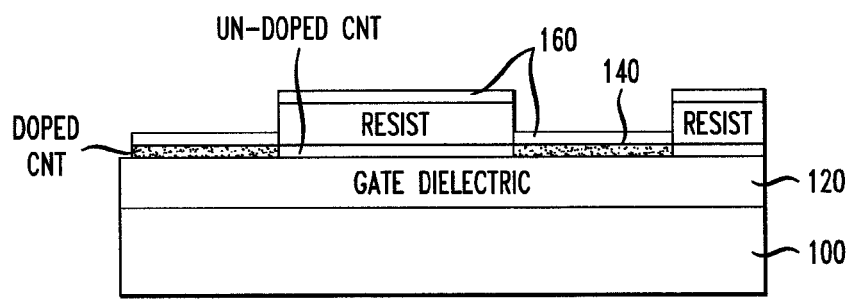
FIG. 8 illustrates a step in another embodiment of forming a CNFET, according to an embodiment of the present invention.
Figure 9:
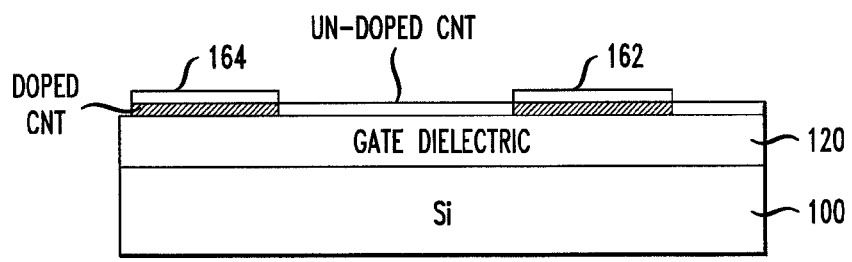
FIG. 9 illustrates a step in another embodiment of forming a CNFET, according to an embodiment of the present invention.

As detailed below, FIGS. 7-9 illustrate steps in another embodiment of forming a carbon nanotube FET, or more generally, a FET with a channel comprising a nano-component such as other semiconducting nanotubes, nanowires or nanocrystal films. After the carbon nanotube or nano-component 140 is deposited on gate dielectric 120, which has previously been formed over substrate 100, a patterned resist is formed on the carbon nanotube 140 using conventional lithographic techniques such as e-beam or photolithography.

The structure (shown in FIG. 7) containing the patterned resist and carbon nanotube 140 is immersed in an organic solution including a suitable dopant (as detailed herein). The doping molecules bond to the exposed portions of the carbon nanotube 140. Following doping of the nanotube 140, a metal layer 160 having a thickness ranging from about 15 nm to about 50 nm is deposited over the patterned resist and the doped carbon nanotube 140. As previously described, Pd, Ti, W, Au, Co, Pt, or alloys thereof, or one or more metallic nanotubes can be used for metal 160. Metallic nanotubes can be deposited using solution phase techniques such as spin coating, while electron beam or vacuum evaporation can be used for deposition of other metals or alloys.

Following deposition of the metal, the structure shown in FIG. 8 is immersed in acetone or NMP for resist liftoff. As shown in FIG. 9, metal portions 162, 164 remaining after resist liftoff form the source and drain of the FET. The process of FIGS. 7-9 generates a significant doping profile difference along the channel of the carbon nanotube transistor. Note that in this case, the undoped portion (portion 500 in FIG. 6, for example) of the carbon nanotube 140 forms the channel of the FET.

To complete the formation of the FET devices illustrated in FIGS. 1-9, passivation can be performed by covering the respective devices with a spin-on organic material like poly (methyl methacrylate) (PMMA) or hydrogensilsesquioxanes (HSQ)—a low K dielectric layer, or by depositing a low temperature dielectric film such as silicon dioxide. Further processing of the device is accomplished via metallization for the back-end of the line.

In an aspect of the invention, CNT/graphene dopant solution is prepared via mixing a number of charge transfer doping compounds in variety of solvents at concentrations ranging from 0.1 mM-100 mM. In one or more embodiments of the invention, charge transfer doping compounds can include, for example, Cerium Ammonium Nitrate, Cerium Ammonium Sulfate, Ruthenium bipyridyl complex, and triethyloxonium hexachloro antimonate. Solvents can include water, dichloroethane, alcohols, dichlorobenzene, etc.

Additionally, in another aspect of the invention, a nanotube or graphene FET device, fabricated on a substrate with an exposed contact region (areas with contact metal will experience evaporation), is dipped in the dopant solution. In an embodiment of the invention, the FET device can be dipped into the dopant solution for a duration of from one second to 10 hours, depending upon of the concentration of the solution used. (A stronger concentration will require a shorter the duration.) At high doping time, the mobility of channel decreases due to the scattering by dopants. The same will happen at the contacts. The substrate is then removed from dopant solution and rinsed with a respective dopant solvent. In an example embodiment, the substrate is cleaned with an amount of solvent (water, ethanol, etc.) sufficient to remove excess dopant solution (that is, to remove the unreacted dopant molecules).

In at least one embodiment of the invention, the above-noted step of applying dopant solution to the device can also be performed by stamping the dopant directly over the FET channel areas. This stamping can be done by using polymer based stamps (PDMS), ink jet printing, brushing, screen printing, etc. The dipping of the substrate in the dopant solution ensures the doping of the contact area of the device. Thereafter, contact metal is deposited over the doped region.

Accordingly, an aspect of the invention uses newly developed water-soluble dopants (for example, Ruthenium(III) and Cerium (IV) salts) in selectively doping the metal contact region of a carbon nanotube or graphene field effect transistor to achieve better electronic performance. An embodiment uses the water doping medium to make the doping process complementary metal-oxide-semiconductor—(CMOS)-compatible; hence, a selective region below the metal contacts can be doped to decrease the contact resistance of the field effect device. Additionally, at least one embodiment of the invention includes using single wall nanotubes and graphene.

Figure 10:
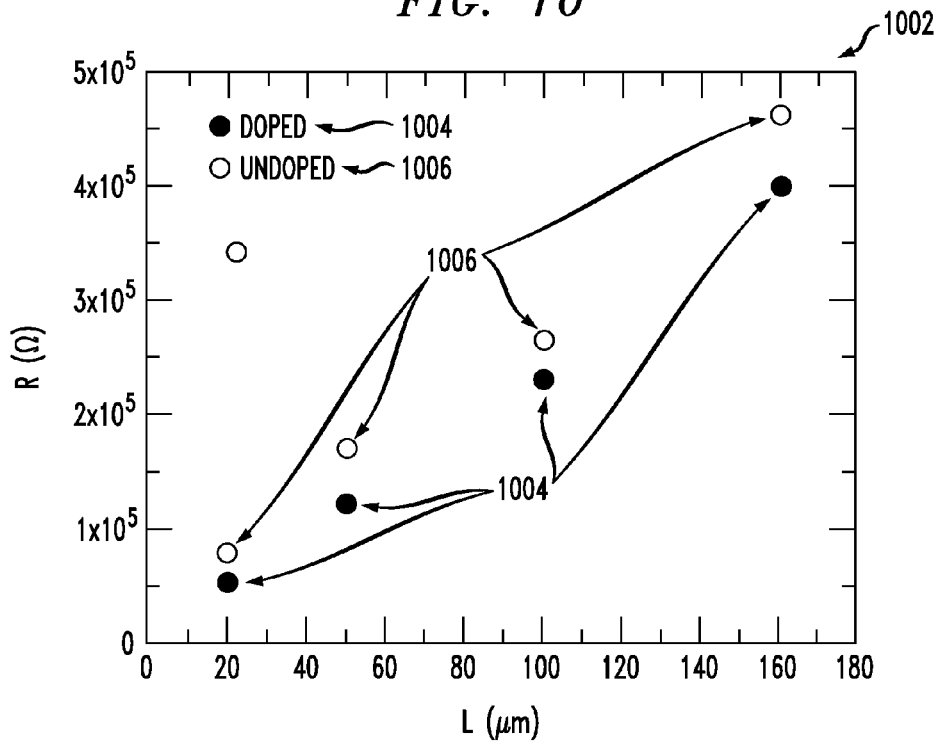
FIG. 10 includes a graph illustrating channel resistance versus channel length for a carbon nanotube thin film transistor before and after doping of the contact using Ruthenium Bipyridyl Complex.

FIG. 10 includes a graph 1002 illustrating channel resistance versus channel length for a carbon nanotube thin film transistor before 1006 and after 1004 doping of the contact using Ruthenium Bipyridyl Complex. Graph 1002 is indicating a downward shift in the R versus L graph with contact doping. Because the y-intercept of the line denotes the contact resistance of the FET device, a downward shift implies a decrease in the contact resistance with contact doping.

Figure 11:
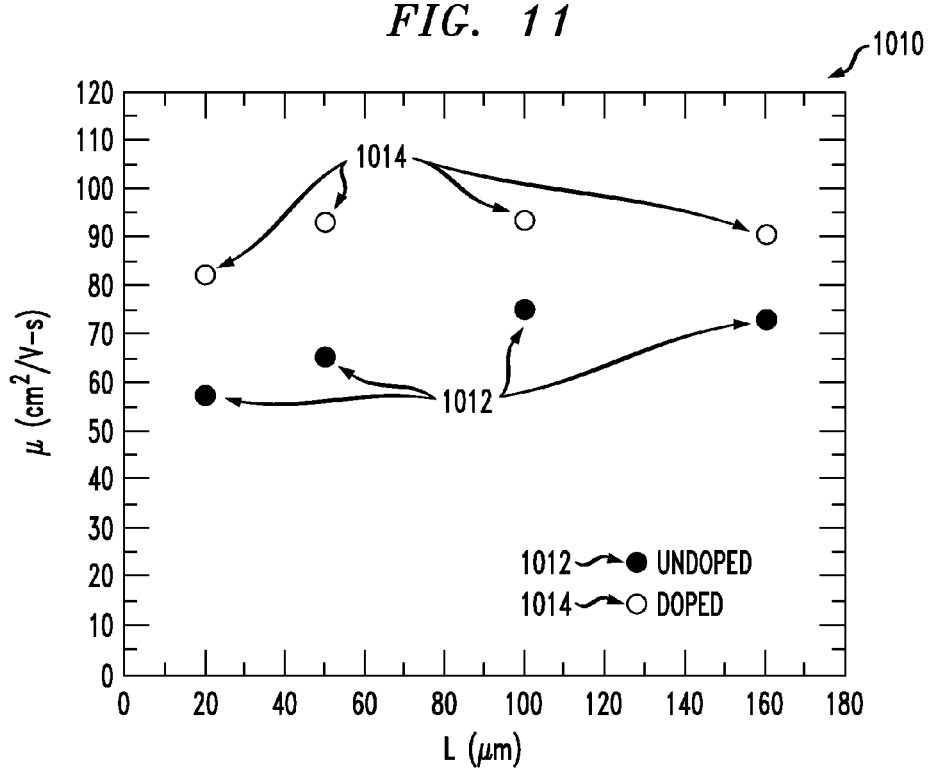
FIG. 11 includes a graph illustrating mobility versus channel length for a carbon nanotube thin film transistor before and after doping of the contact using Ruthenium Bipyridyl Complex.

FIG. 11 includes a graph 1010 illustrating mobility versus channel length for a carbon nanotube thin film transistor before 1012 and after 1014 doping of the contact using Ruthenium Bipyridyl Complex. Graph 1010 is depicting the mobility of the FET device being increased with doping of the contacts.

The impact of charge transfer doping on the metal-graphene contact resistance is described herein. For example, doping a single layer graphene at around $6 \times 10^{12}$ cm$^{-2}$ does not lead to reduction in palladium-graphene contact resistance because the number of conduction modes in graphene underneath palladium is primarily determined by the intrinsic properties of the dipole formation and broadening of the density of states. On the contrary, in bi-layer graphene transistors, the contact resistance is reduced by around 40% by introducing similar doping concentration, due to the effective enhancement of the number of conduction modes in both bilayer graphene underneath palladium and in channel. An example embodiment of the invention includes a contact resistance of 60±20 Ω·μm at the palladium bilayer graphene interface. In addition, embodiments of the invention also include a doping-induced band gap opening of 15 millielectron volts (meV) in bilayer graphene transistors.

Figure 12:
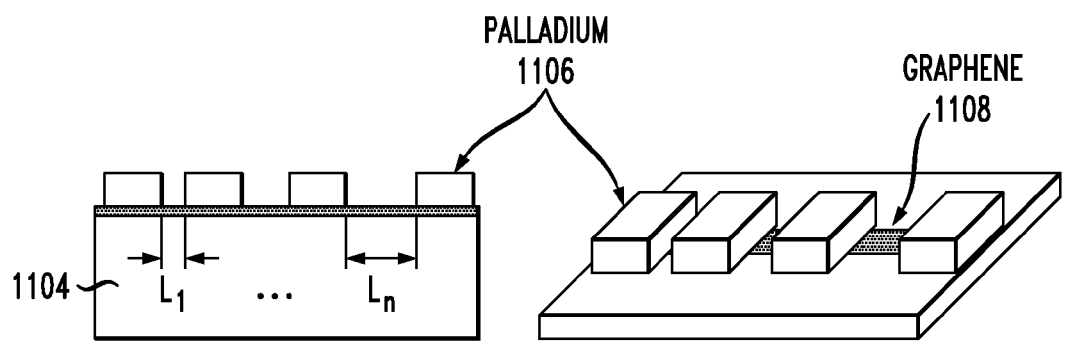
FIG. 12 is a diagram illustrating an example graphene field-effect-transistor array, according to an embodiment of the present invention.
Figure 13:
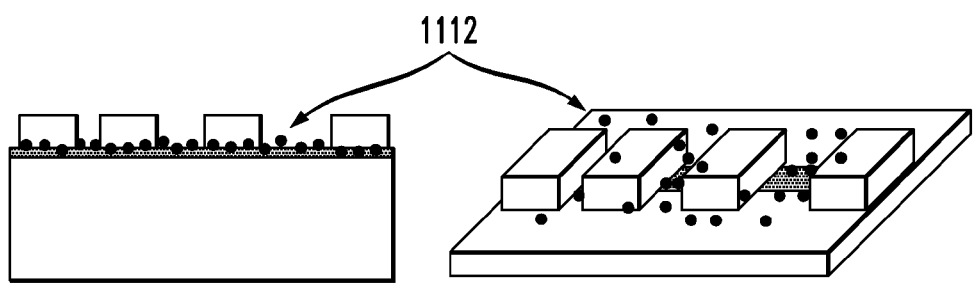
FIG. 13 is a diagram illustrating an example graphene field-effect-transistor array, according to an embodiment of the present invention.
Figure 14:
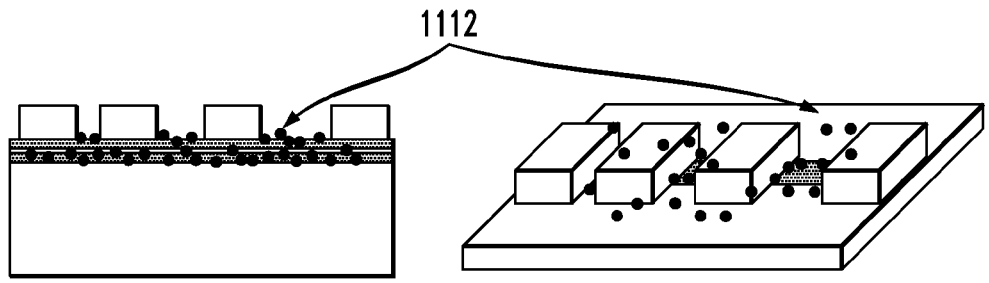
FIG. 14 is a diagram illustrating an example graphene field-effect-transistor array, according to an embodiment of the present invention.

FIG. 12 through FIG. 14 include diagrams illustrating graphene field-effect-transistor arrays, according to an embodiment of the present invention. In accordance with an aspect of the invention, the illustrations of FIG. 12 through FIG. 14 can be valid for CNTs as well. By way of illustration, FIG. 12 depicts a graphene field-effect transistor (FET) array that includes a substrate 1104, palladium channels 1106 and graphene 1108, with varying channel length but without doping. FIG. 13 depicts a single layer graphene FET array with varying channel length and doping 1112 performed before metallization. Further, FIG. 14 depicts a bilayer graphene FET array with varying channel length and doping 1112 performed after metallization.

Figure 15:
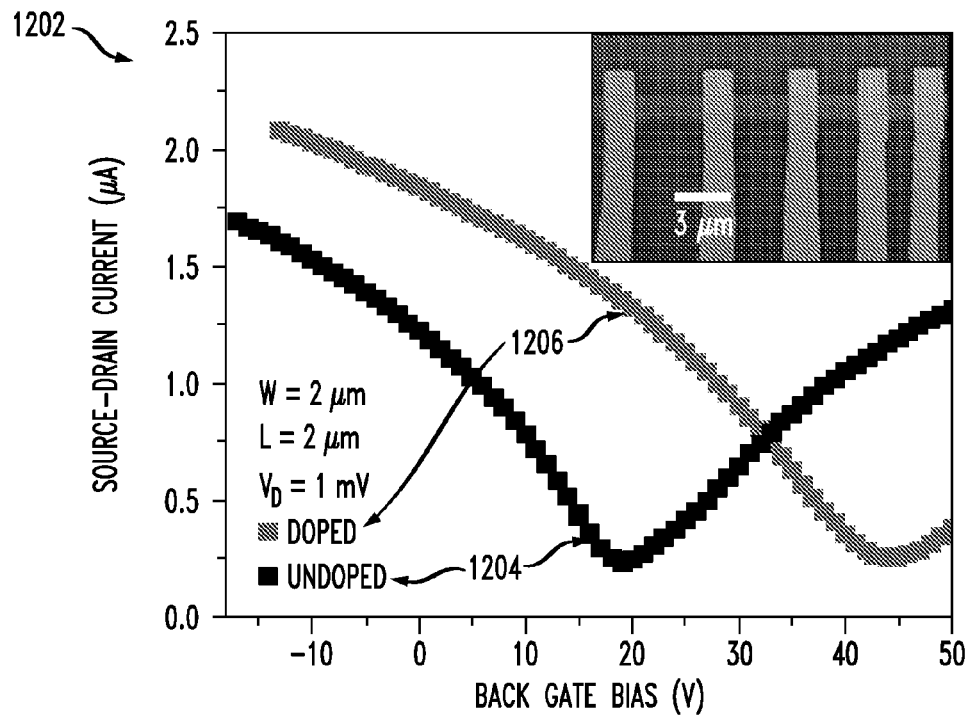
FIG. 15 includes a graph illustrating the impact of doping on palladium/single layer graphene contact resistance, according to an embodiment of the present invention.
Figure 16:
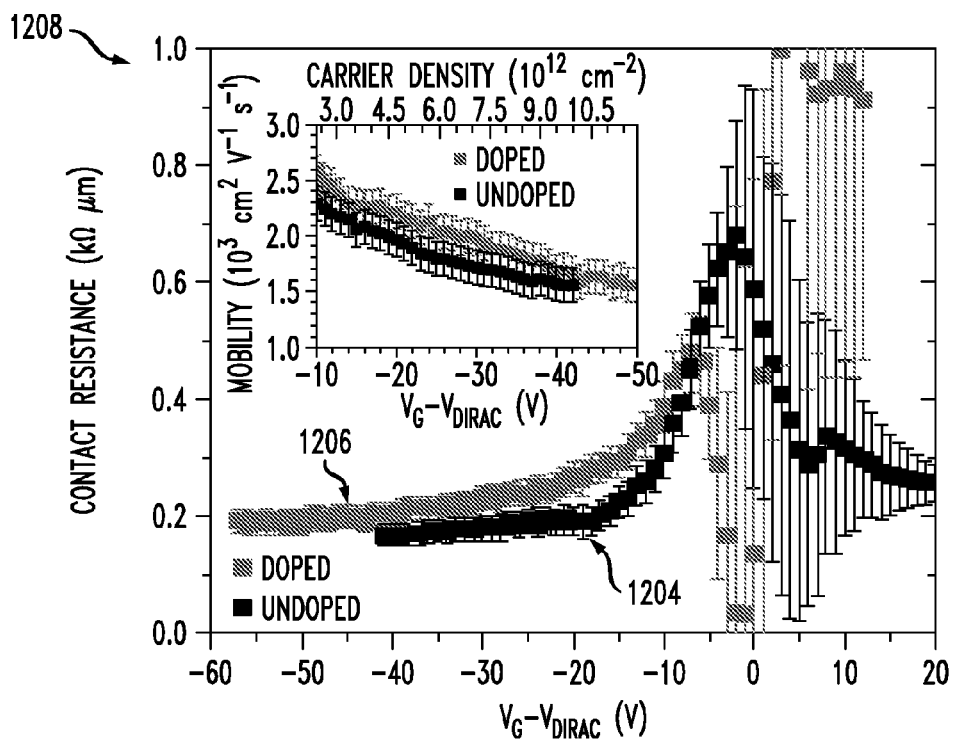
FIG. 16 includes a graph illustrating the impact of doping on palladium/single layer graphene contact resistance, according to an embodiment of the present invention.

FIG. 15 and FIG. 16 include graphs illustrating the impact of doping on palladium/single layer graphene contact resistance, according to an embodiment of the present invention. By way of illustration, in FIG. 15, graph 1202 depicts the transfer characteristics of single layer graphene FETs with (1206) and without doping (1204). The inset in graph 1202 depicts the scanning electron micrograph of a typical FET array. In FIG. 16, graph 1208 depicts measured contact resistance normalized to the gate bias in graphene FET arrays with (1206) and without doping (1204). The inset in graph 1208 depicts measured hole mobility in single layer graphene FET arrays with and without doping. Doping (performed after metallization for purposes of FIG. 15 through FIG. 18) has negligible impact on both mobility and contact resistance. The graphs depicted in FIG. 15 and FIG. 16 indicate that doping the channel does not change the contact resistance, nor increase the device mobility in the case of graphene.

Figure 17:
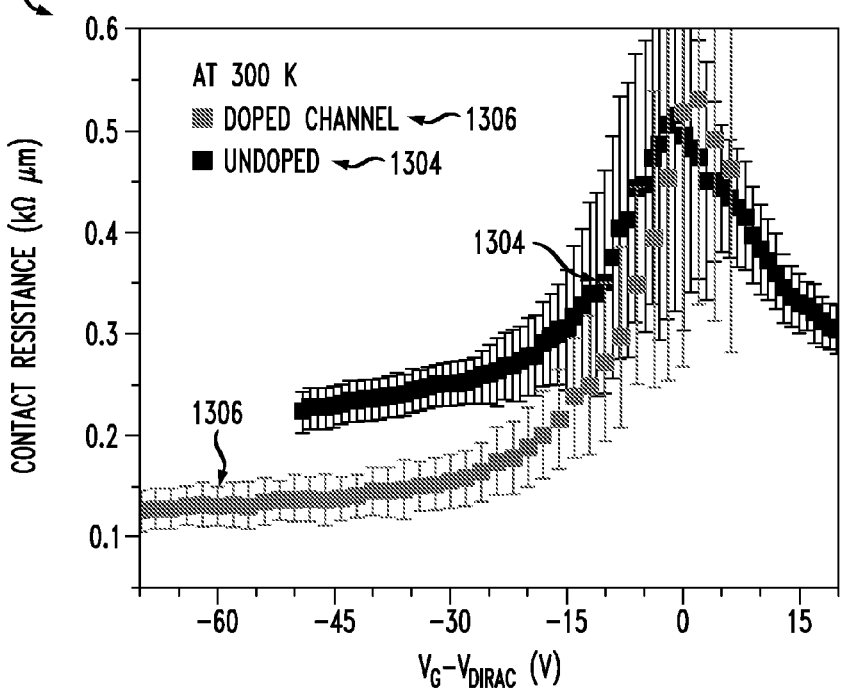
FIG. 17 includes a graph illustrating the impact of doping on palladium/bilayer graphene contact resistance, according to an embodiment of the present invention.
Figure 18:
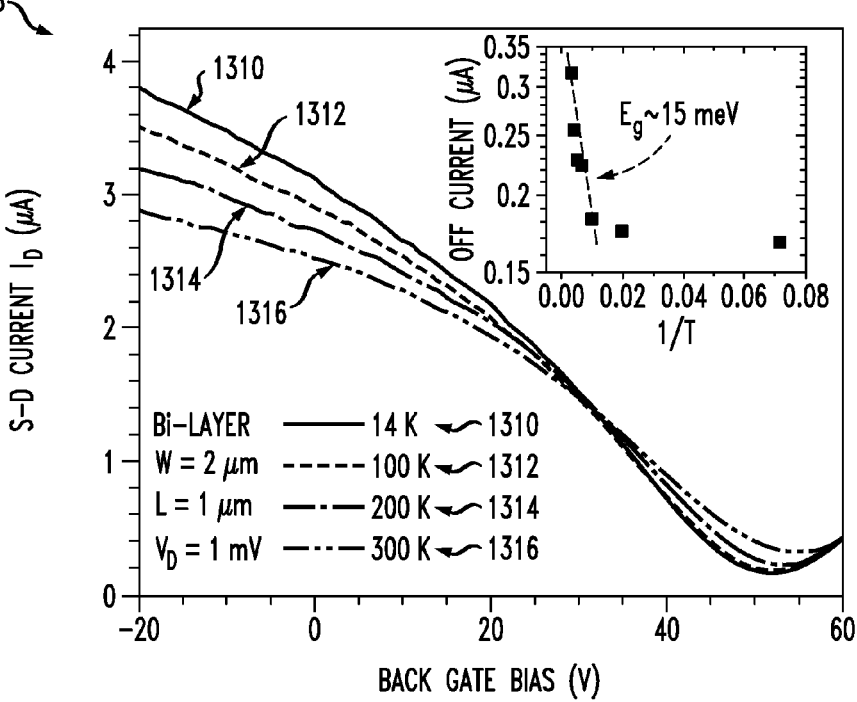
FIG. 18 includes a graph illustrating the impact of doping on palladium/bilayer graphene contact resistance, according to an embodiment of the present invention.

FIG. 17 and FIG. 18 include graphs illustrating the impact of doping on palladium/bilayer graphene contact resistance, according to an embodiment of the present invention. By way of illustration, in FIG. 17, graph 1302 depicts measured contact resistance at room temperature with (1306) and without doping (1304). As used herein, $V_G$ is the back gate voltage, and $V_{dirac}$ is the back gate voltage at which the charge concentration in the channel is the minimum. For graphene, this could still be a finite number because graphene is a semi-metal, but for nanotubes (semiconducting ones in particular) at $V_G=V_{Dirac}$, the charge concentration is zero. In FIG. 18, graph 1308 depicts the transfer characteristics of a bilayer graphene FET with 1 μm channel length and doping at various temperatures. Line 1310 depicts 14 Kelvin (K), line 1312 depicts 100 K, line 1314 depicts 200 K and line 1316 depicts 300 K. The inset of graph 1308 depicts temperature dependent off current from which the doping induced band gap is inferred.

Figure 19:
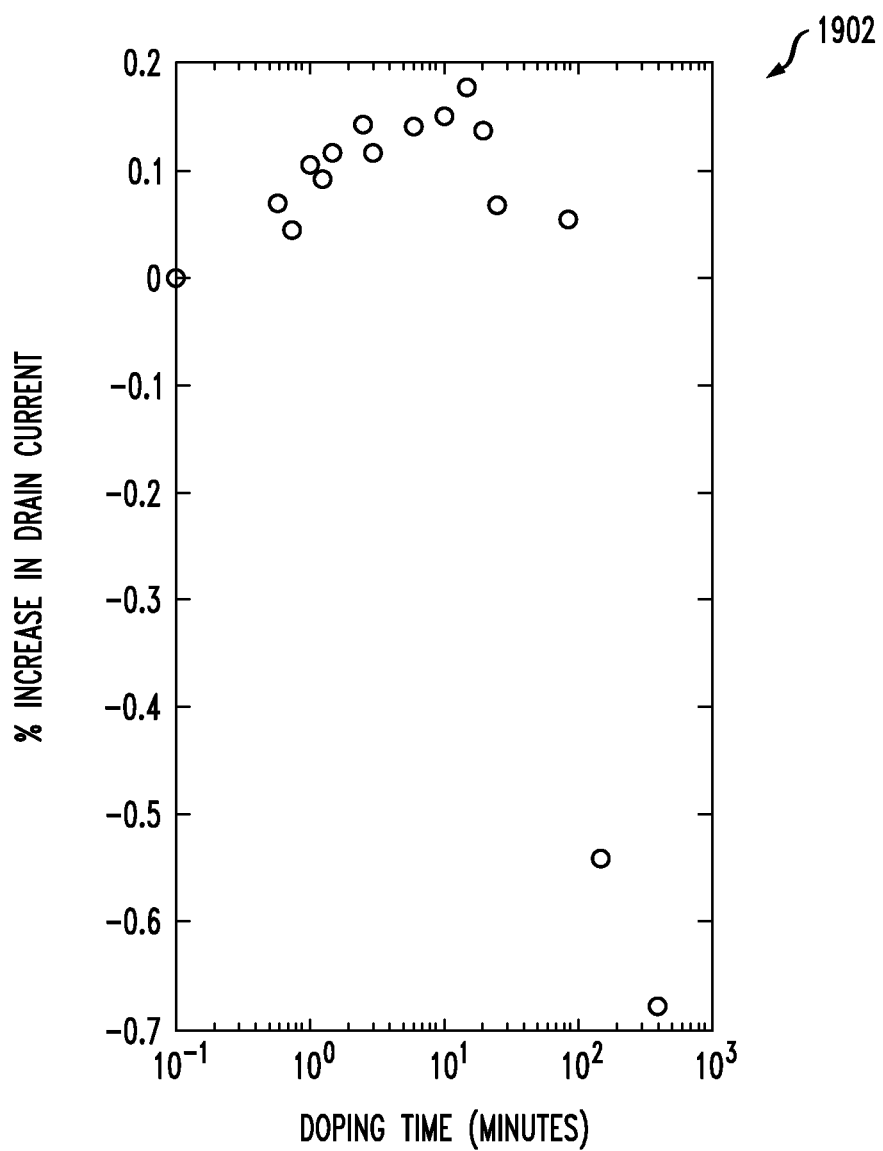
FIG. 19 includes a graph illustrating FET channel doping using Ruthenium Bipyridyl complex, according to an embodiment of the present invention.

FIG. 19 includes a graph illustrating FET channel doping using Ruthenium Bipyridyl complex, according to an embodiment of the present invention. By way of illustration, graph 1902 depicts FET channel doping using Ruthenium Bipyridyl complex, with a dopant concentration of approximately 5 mM. Graph 1902 shows the doping time dependence of drain current. Until time <10 minutes, the doping has a positive effect on channel current (increased by approximately 20%); however, for longer times the current starts decreasing.

Figure 20:
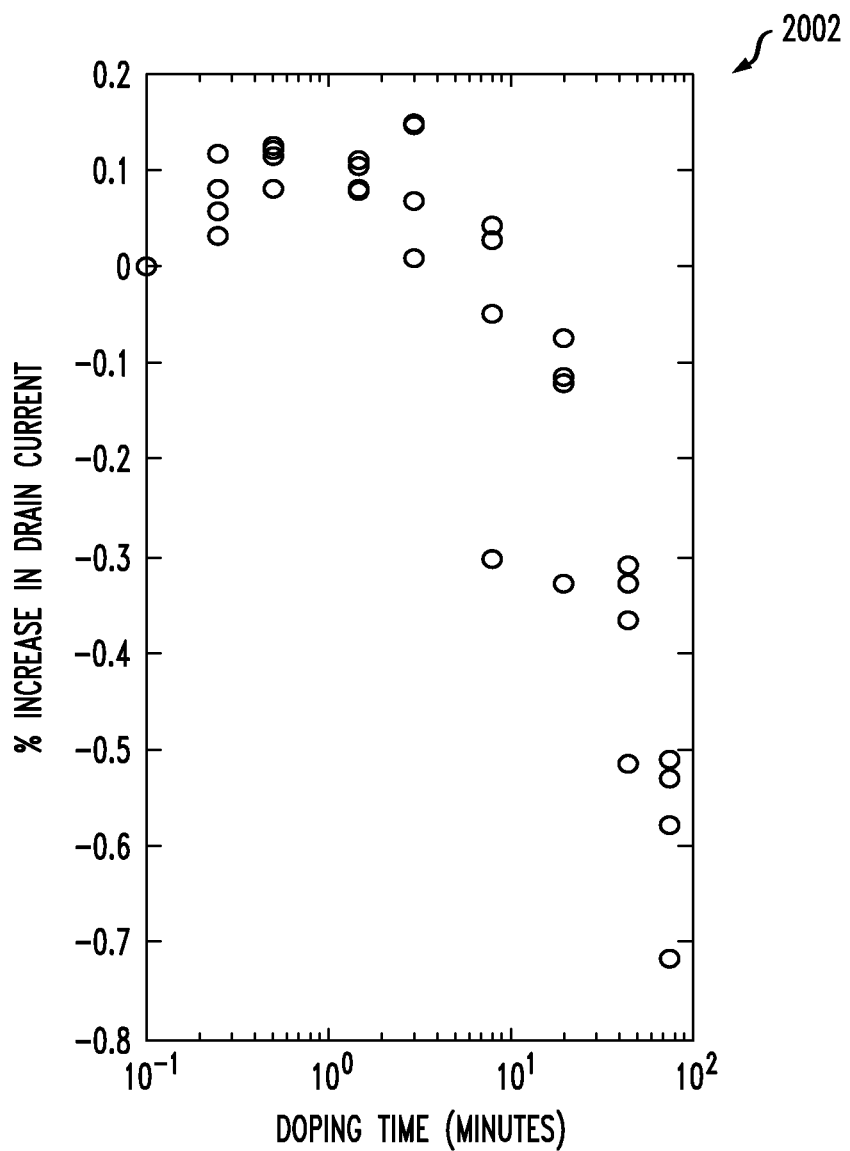
FIG. 20 includes a graph illustrating FET channel doping using Ruthenium Bipyridyl complex, according to an embodiment of the present invention.

FIG. 20 includes a graph illustrating FET channel doping using Ruthenium Bipyridyl complex, according to an embodiment of the present invention. By way of illustration, graph 2002 depicts FET channel doping using Ruthenium Bipyridyl complex, with a dopant concentration of approximately 10 mM. Graph 2002 shows the doping time dependence of drain current. Until time <10 minutes, the doping has a positive effect on channel current (increased by approximately 10-15%); however, for longer times the current starts decreasing.

As detailed herein, an aspect of the present invention includes techniques for doping a graphene and nanotube field-effect transistor device to decrease contact resistance with a metal electrode, including the step of selectively applying a dopant to a metal contact region of a graphene and nanotube field-effect transistor device to decrease the contact resistance of the field-effect transistor device. Such a technique can additionally include depositing contact metal over the doped metal contact region of the graphene and nanotube field-effect transistor device.

In at least one embodiment of the invention, the dopant is a dopant solution. Selectively applying a dopant solution to a metal contact region of a graphene and nanotube field-effect transistor device can include placing the graphene and nanotube field-effect transistor device in a dopant solution for a duration of time (for example, a range of one second to ten hours). Also, the duration of time can be based on the concentration of the dopant being applied. If doped at a high concentration and/or for a long duration of time, the dopant molecule can possibly form a thick layer and prevent the electron transmission from metals.

As noted herein, the graphene and nanotube field-effect transistor device can be removed from the dopant solution and rinsed with a dopant solvent (for example, to remove the dopant solution from non-metal contact regions of the graphene and nanotube field-effect transistor device with a dopant solvent).

In another embodiment of the invention, the dopant is in a gel mixture in which the gel evaporates after application. Such an implementation is particularly effective for the process where the dopant is stamped.

Accordingly, selectively applying a dopant to a metal contact region of a graphene and nanotube field-effect transistor device includes stamping the dopant directly over the contact area of the graphene and nanotube field-effect transistor device.

As detailed herein, an apparatus implementing the techniques described above can include a substrate, a graphene and nanotube field-effect transistor device fabricated on the substrate with an exposed contact region, wherein the contact region is doped with a dopant (in solution or gel form), and contact metal deposited over the doped contact region of the graphene and nanotube field-effect transistor device. Additionally, in another aspect of the invention, such an apparatus can include contact metal, a substrate, and a graphene and nanotube field-effect transistor device fabricated on the substrate and deposited over the contact metal, wherein material areas supported under by the contact metal are doped with a dopant (in solution or gel form). That is, graphene and CNT electrical materials are transferred over pre-fabricated electrodes, and the regions of the materials over the electrodes are selectively doped.

The decrease in contact resistance post doping is due to the increase in charge carrier concentration at the metal-CNT/graphene interface.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for doping at least one of a graphene and a nanotube thin-film transistor field-effect transistor device to decrease contact resistance with a metal electrode, comprising:

selectively applying a water-soluble dopant to a metal contact region of at least one of a graphene and a nanotube field-effect transistor device to decrease the contact resistance of the field-effect transistor device, wherein said water-soluble dopant comprises one of cerium ammonium nitrate and cerium ammonium sulfate, and wherein said selectively applying comprises placing the at least one of a graphene and a nanotube field-effect transistor device in a water-soluble dopant solution for a duration of time based on the concentration of the water-soluble dopant.

2. The method of claim 1, further comprising depositing contact metal over the doped metal contact region of the at least one of a graphene and a nanotube field-effect transistor device.

3. The method of claim 1, wherein the dopant is a dopant solution.

4. The method of claim 3, wherein the dopant solution comprises a mixture of at least one charge transfer doping compound in a solvent at a concentration in a range of 0.1 millimole (mM) to 100 mM.

5. The method of claim 4, wherein the at least one charge transfer doping compound comprises ruthenium bipyridyl complex.

6. The method of claim 4, wherein the at least one charge transfer doping compound comprises triethyloxonium hexachloro antimonate.

7. The method of claim 4, wherein the solvent comprises at least one of water, dichloroethane, alcohol, and dichlorobenzene.

8. The method of claim 1, wherein the dopant is in a gel mixture in which the gel evaporates after application.

9. The method of claim 1, wherein the duration of time comprises a range of one second to ten hours.

10. The method of claim 1, further comprising removing the at least one of a graphene and a nanotube field-effect transistor device from the dopant solution and rinsing with a dopant solvent.

11. The method of claim 1, further comprising removing the dopant solution from non-metal contact regions of the at least one of a graphene and a nanotube field-effect transistor device with a dopant solvent.

12. The method of claim 1, wherein selectively applying a dopant to a metal contact region of at least one of a graphene and a nanotube field-effect transistor device comprises stamping the dopant directly over a channel area of the at least one graphene and nanotube field-effect transistor device.

13. The method of claim 12, wherein stamping comprises using one of a polymer based stamp, ink-jet printing, brushing, and screen printing.

14. An apparatus, comprising:
a substrate;
at least one of a graphene and a nanotube field-effect transistor device fabricated on the substrate with an exposed contact region, wherein the contact region is doped with a water-soluble dopant for a duration of time based on the concentration of the water-soluble dopant, wherein said water-soluble dopant comprises one of cerium ammonium nitrate and cerium ammonium sulfate; and
contact metal deposited over the doped contact region of the at least one of a graphene and a nanotube field-effect transistor device.

15. The apparatus of claim 14, wherein the dopant comprises a mixture of at least one charge transfer doping compound in a solvent at a concentration in a range of 0.1 millimole (mM) to 100 mM.

16. The apparatus of claim 15, wherein the at least one charge transfer doping compound comprises one of ruthenium bipyridyl complex, and triethyloxonium hexachloro antimonate.

17. The apparatus of claim 15, wherein the solvent comprises at least one of water, dichloroethane, alcohol, and dichlorobenzene.

18. An apparatus, comprising:
contact metal;
a substrate; and
at least one of a graphene and a nanotube field-effect transistor device fabricated on the substrate and deposited over the contact metal, wherein material areas supported under by the contact metal are doped with a water-soluble dopant for a duration of time based on the concentration of the water-soluble dopant, wherein said water-soluble dopant comprises one of cerium ammonium nitrate and cerium ammonium sulfate.

19. The apparatus of claim 18, wherein the dopant comprises a mixture of at least one charge transfer doping compound in a solvent at a concentration in a range of 0.1 millimole (mM) to 100 mM.

20. The apparatus of claim 19, wherein the at least one charge transfer doping compound comprises one of ruthenium bipyridyl complex, and triethyloxonium hexachloro antimonate.

21. The apparatus of claim 19, wherein the solvent comprises at least one of water, dichloroethane, alcohol, and dichlorobenzene.

* * * * *